(12) United States Patent
Nakajima et al.

(10) Patent No.: US 9,129,995 B2
(45) Date of Patent: Sep. 8, 2015

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Kazuaki Nakajima, Mie-ken (JP); Atsushi Murakoshi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/107,492

(22) Filed: Dec. 16, 2013

(65) Prior Publication Data
US 2015/0054047 A1    Feb. 26, 2015

Related U.S. Application Data
(60) Provisional application No. 61/869,210, filed on Aug. 23, 2013.

(51) Int. Cl.
| H01L 29/66 | (2006.01) |
| H01L 21/28 | (2006.01) |
| H01L 27/115 | (2006.01) |
| H01L 29/788 | (2006.01) |

(52) U.S. Cl.
CPC .... *H01L 29/66825* (2013.01); *H01L 21/28273* (2013.01); *H01L 27/11521* (2013.01); *H01L 29/7881* (2013.01)

(58) Field of Classification Search
CPC ............ H01L 27/11529; H01L 29/798792
USPC ................................................. 257/758
See application file for complete search history.

(56) References Cited

U.S. PATENT DOCUMENTS

| 6,469,339 | B1 * | 10/2002 | Onakado et al. ........... 257/315 |
| 7,898,020 | B2 | 3/2011 | Makihara et al. |
| 2002/0179961 | A1 * | 12/2002 | Tsunoda et al. ............ 257/315 |
| 2010/0044770 | A1 | 2/2010 | Lee |
| 2010/0184275 | A1 * | 7/2010 | Takeuchi et al. ........... 438/482 |
| 2011/0287624 | A1 * | 11/2011 | Nitta ............................ 438/593 |
| 2012/0094451 | A1 * | 4/2012 | Hong et al. .................. 438/258 |
| 2012/0273869 | A1 * | 11/2012 | Yasuda ........................ 257/324 |
| 2013/0082315 | A1 * | 4/2013 | Hosoda et al. ............. 257/315 |
| 2013/0126960 | A1 * | 5/2013 | Chakihara et al. .......... 257/324 |
| 2013/0214342 | A1 * | 8/2013 | Sato ............................ 257/316 |

FOREIGN PATENT DOCUMENTS
JP    2008-258286    10/2008

* cited by examiner

*Primary Examiner* — Yu-Hsi D Sun
*Assistant Examiner* — Wasiul Haider
(74) *Attorney, Agent, or Firm* — Oblon, McClelland, Maier & Neustadt, L.L.P.

(57) ABSTRACT

According to one embodiment, a semiconductor memory device includes a semiconductor substrate, a first insulating film provided on the semiconductor substrate, a silicon film provided on the first insulating film, a metal silicide film provided on the silicon film, a second insulating film provided on the metal silicide film, and an electrode provided on the second insulating film.

7 Claims, 10 Drawing Sheets

AA-DIRECTION
CG-DIRECTION

VERTICAL DIRECTION
CG-DIRECTION

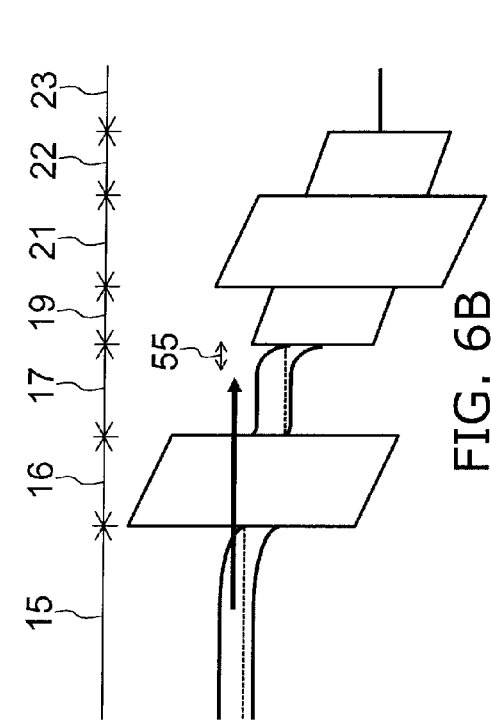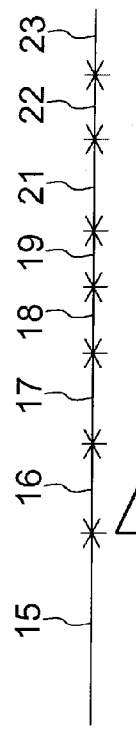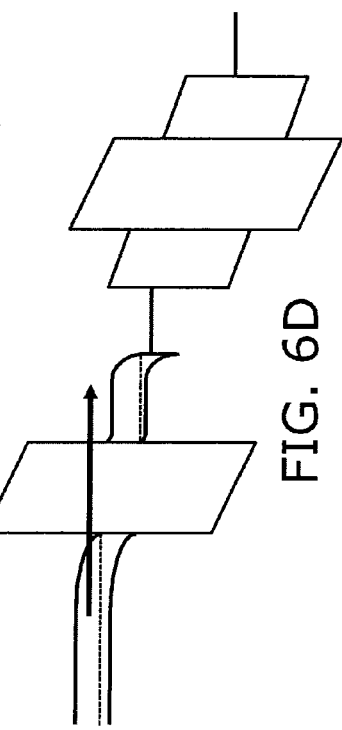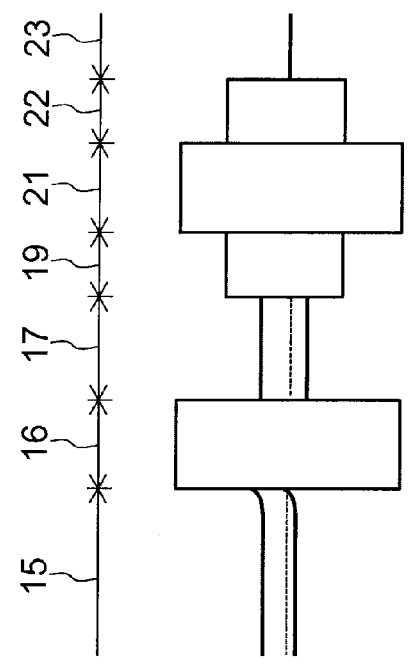
FIG. 6A
FIG. 6B
FIG. 6C
FIG. 6D

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/869,210, filed on Aug. 23, 2013; the entire contents of which are incorporated herein by reference.

FIELD

Embodiments described herein relate generally to a semiconductor memory device and a method for manufacturing the same.

BACKGROUND

Conventionally, as a nonvolatile memory device, a NAND flash memory has been developed. The NAND flash memory is a device for storing data by injecting charge into a floating gate electrode made of silicon to change the threshold of a field effect transistor including this floating gate electrode. In such a memory device, increasing the memory density requires shrink of the structure. However, shrink of the structure causes the problem of degraded retention characteristics for charge injected into the floating gate electrode.

BRIEF DESCRIPTION OF THE DRAWINGS

FIGS. 6A to 6D are band gap diagrams illustrating an effect of the first embodiment;

DETAILED DESCRIPTION

In general, according to one embodiment, a semiconductor memory device includes a semiconductor substrate, a first insulating film provided on the semiconductor substrate, a silicon film provided on the first insulating film, a metal silicide film provided on the silicon film, a second insulating film provided on the metal silicide film, and an electrode provided on the second insulating film.

In general, according to one embodiment, method for manufacturing a semiconductor memory device includes forming a first insulating film, a silicon film, a metal silicide film, and a second insulating film in this order on a semiconductor substrate. The method includes forming a plurality of first stacked bodies shaped like lines extending in a first direction and forming a trench extending in the first direction in an upper part of the semiconductor substrate by selectively removing the second insulating film, the metal silicide film, the silicon film, and the first insulating film. The method includes forming a device isolation insulator by embedding an oxygen-containing insulating material in the trench and between the first stacked bodies. The method includes forming an electrode on the second insulating film. The method includes forming a plurality of second stacked bodies shaped like lines extending in a second direction crossing the first direction by selectively removing the electrode, the second insulating film, the metal silicide film, the silicon film, the first insulating film, and the device isolation insulator. And, the method includes embedding an interlayer insulating film made of an oxygen-containing insulating material between the second stacked bodies.

Embodiments of the invention will now be described with reference to the drawings.

First Embodiment

First, a first embodiment is described.

Figure 1:
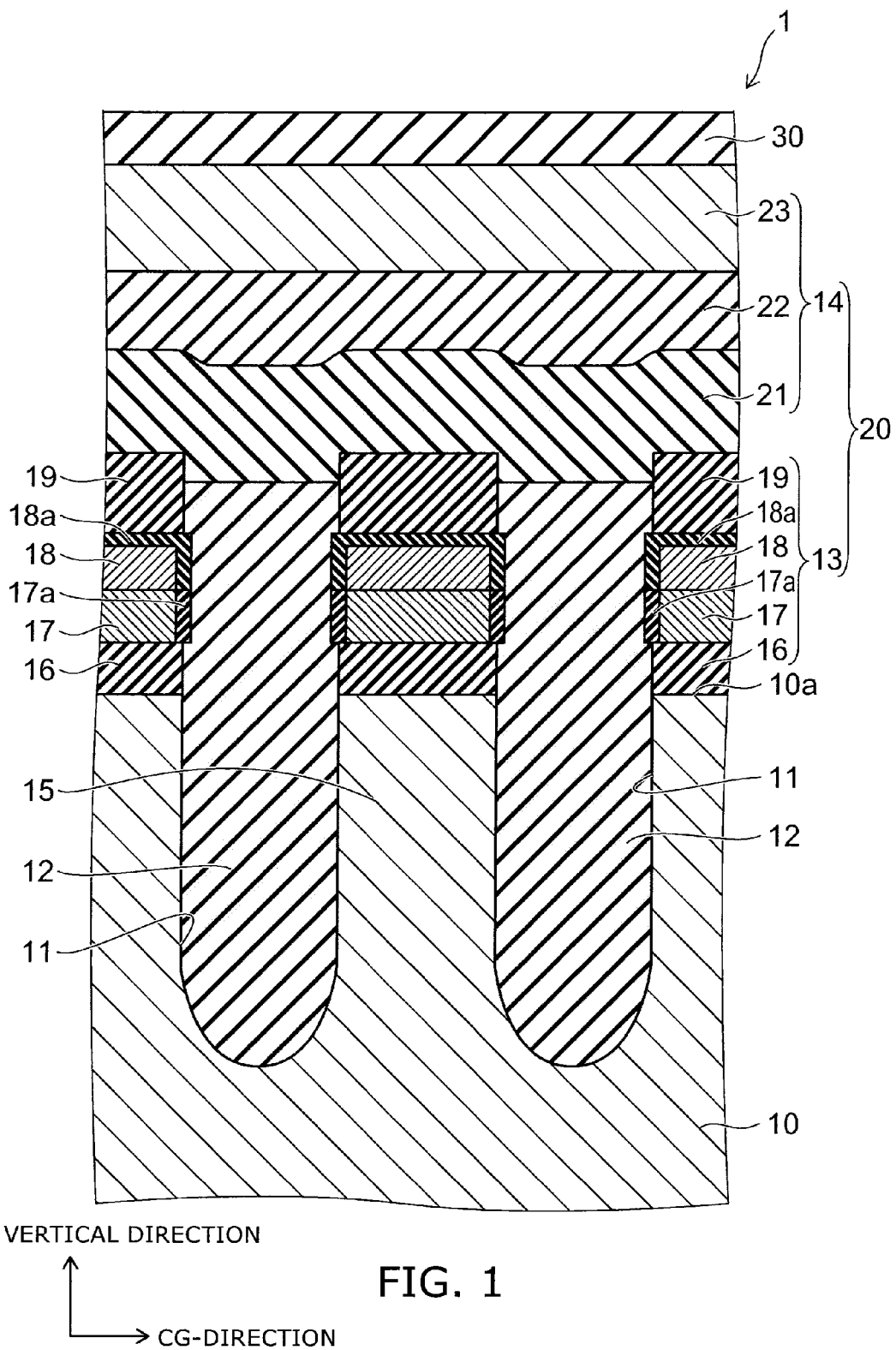
FIG. 1 is a sectional view parallel to a CG-direction illustrating a semiconductor memory device according to a first embodiment.

FIG. 1 is a sectional view parallel to the CG-direction illustrating a semiconductor memory device according to the embodiment.

Figure 2:
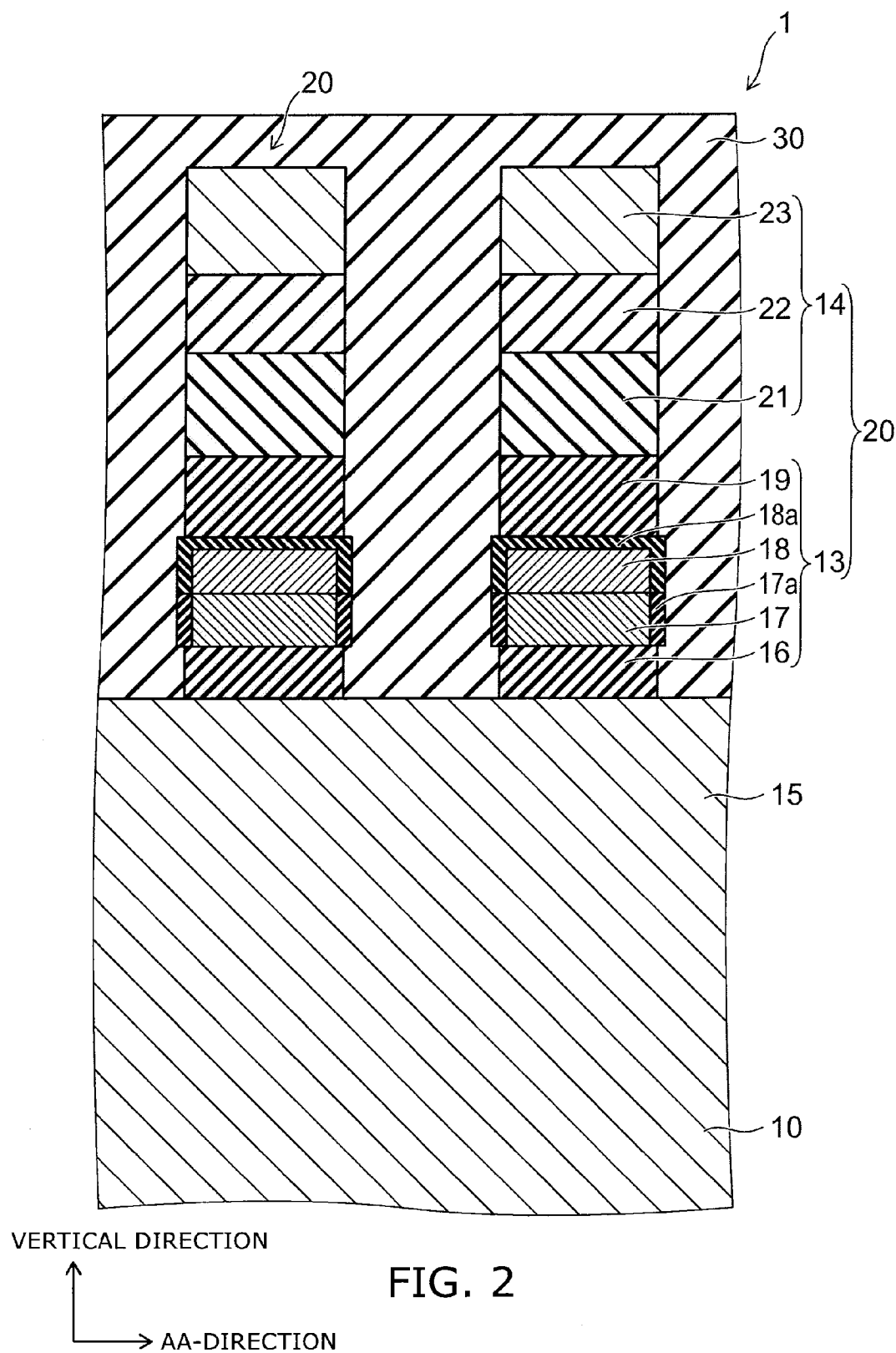
FIG. 2 is a sectional view parallel to an AA-direction illustrating the semiconductor memory device according to the first embodiment.

FIG. 2 is a sectional view parallel to the AA-direction illustrating the semiconductor memory device according to the embodiment.

Figure 3A:
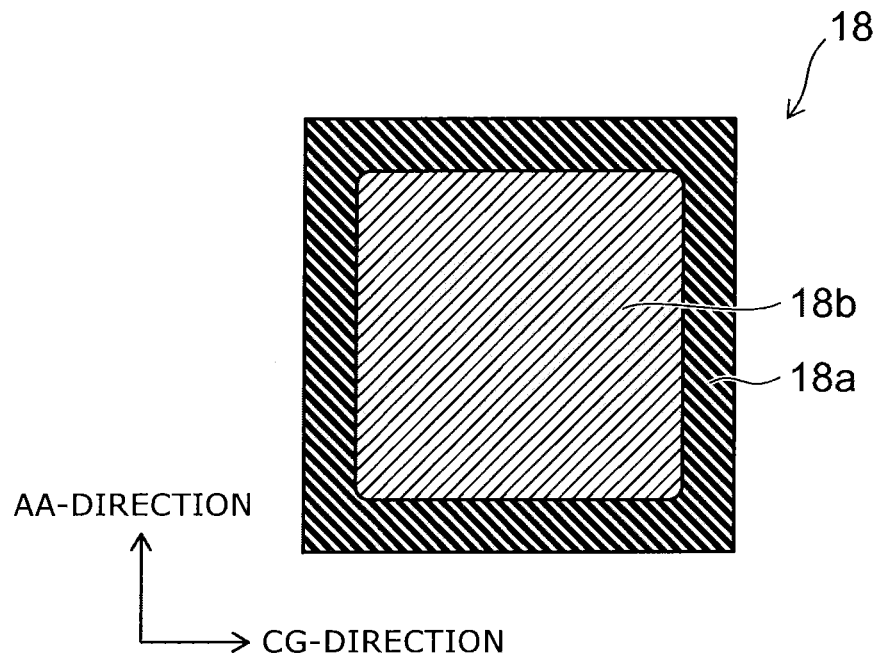
FIGS. 3A and 3B are sectional views illustrating a metal silicide film of the first embodiment.
Figure 3B:
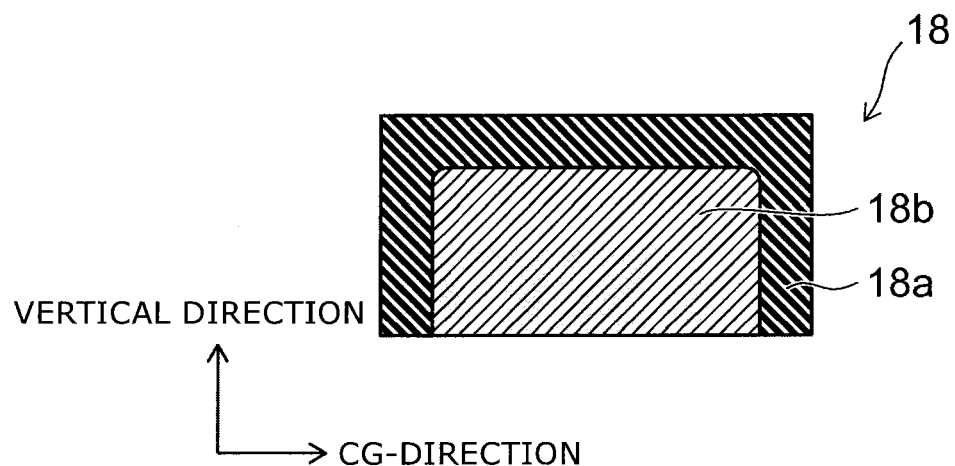

FIGS. 3A and 3B are sectional views illustrating a metal silicide film of the embodiment.

The semiconductor memory device according to the embodiment is a NAND flash memory.

As shown in FIGS. 1 and 2, the semiconductor memory device 1 according to the embodiment includes a silicon substrate 10. In the upper surface 10*a* of the silicon substrate 10, a plurality of trenches 11 extending in one direction (hereinafter referred to as "AA-direction") parallel to the upper surface 10*a* are formed.

On the silicon substrate 10, gate stacked bodies 20 are arranged intermittently along the AA-direction. The gate stacked body 20 extends in a direction (hereinafter referred to as "CG-direction") crossing, e.g. being orthogonal to, the AA-direction. Between and above the gate stacked bodies 20, an interlayer insulating film 30 is provided. The interlayer insulating film 30 is formed form an oxygen-containing insulating material such as silicon oxide ($SiO_2$).

In the lower part of the gate stacked body 20, device isolation insulators 12 and lower stacked bodies 13 are arranged alternately along the CG-direction. The device isolation insulator 12 is made of silicon oxide. The lower part of the device isolation insulator 12 is embedded in the trench 11. The upper part of the device isolation insulator 12 is projected upward from the upper surface 10*a* of the silicon substrate 10. The portion of the upper part of the silicon substrate 10 partitioned by the device isolation insulator 12 constitutes an active area 15 extending in the AA-direction.

The lower stacked body 13 is shaped like a pillar extending in the vertical direction. In the semiconductor memory device 1 viewed as a whole, the lower stacked bodies 13 are divided along both the AA-direction and the CG-direction and arranged in a matrix. On the other hand, the upper part of the gate stacked body 20 constitutes an upper stacked body 14 extending in the CG-direction. The upper stacked body 14 is shaped like a line extending in the CG-direction.

In the lower stacked body 13, sequentially from the lower side, a tunnel insulating film 16, a silicon film 17, a metal silicide film 18, and a hafnium oxide film 19 are stacked. The tunnel insulating film 16 is normally insulative. However, upon application of a prescribed voltage within the range of the driving voltage of the semiconductor memory device 1, the tunnel insulating film 16 passes a tunnel current. For instance, the tunnel insulating film 16 is formed from silicon oxide. The silicon film 17 is formed from silicon (Si). The metal silicide film 18 is formed from metal silicide such as tungsten silicide (WSi) or tantalum silicide (TaSi). The silicon film 17 and the metal silicide film 18 form a floating gate electrode. The hafnium oxide film 19 is formed from hafnium oxide ($HfO_2$).

In the upper stacked body 14, sequentially from the lower side, a silicon oxide film 21, a hafnium oxide film 22, and a control gate electrode 23 are stacked. The silicon oxide film 21 is formed from silicon oxide ($SiO_2$). The hafnium oxide film 22 is formed from hafnium oxide ($HfO_2$). The hafnium oxide film 19, the silicon oxide film 21, and the hafnium oxide film 22 form an IPD (inter-poly dielectric) film having a three-layer structure. The control gate electrode 23 is formed from e.g. tungsten (W).

The IPD film is not limited to the aforementioned three-layer film of $HfO_2/SiO_2/HfO_2$ but, for instance, may be a monolayer film, or may contain other insulating materials such as aluminum oxide ($Al_2O_3$). However, from the viewpoint of charge retention characteristics of the floating gate electrode, it is preferable that the permittivity of the IPD film be higher.

As shown in FIGS. 3A and 3B, the metal silicide film 18 is shaped like a generally rectangular solid. The side part and the upper part thereof are oxidized into an oxidized portion 18a. The oxidized portion 18a is formed by selective oxidation of silicon in the metal silicide film 18, and composed primarily of silicon oxide. More specifically, in the metal silicide film 18, the oxidized portion 18a made of silicon oxide is shaped like an inverted cup. A metal silicide portion 18b made of metal silicide is located inside the oxidized portion 18a. In an example, the length in the AA-direction of the metal silicide film 18 is 15 nm (nanometers), the length in the CG-direction is 15 nm, and the length in the vertical direction, i.e. film thickness, is 5-10 nm. The thickness of the oxidized portion 18a is approximately 2 nm. Furthermore, the side part of the silicon film 17 is also oxidized into an oxidized portion 17a.

Next, a method for manufacturing a semiconductor memory device according to the embodiment is described.

Figure 4:
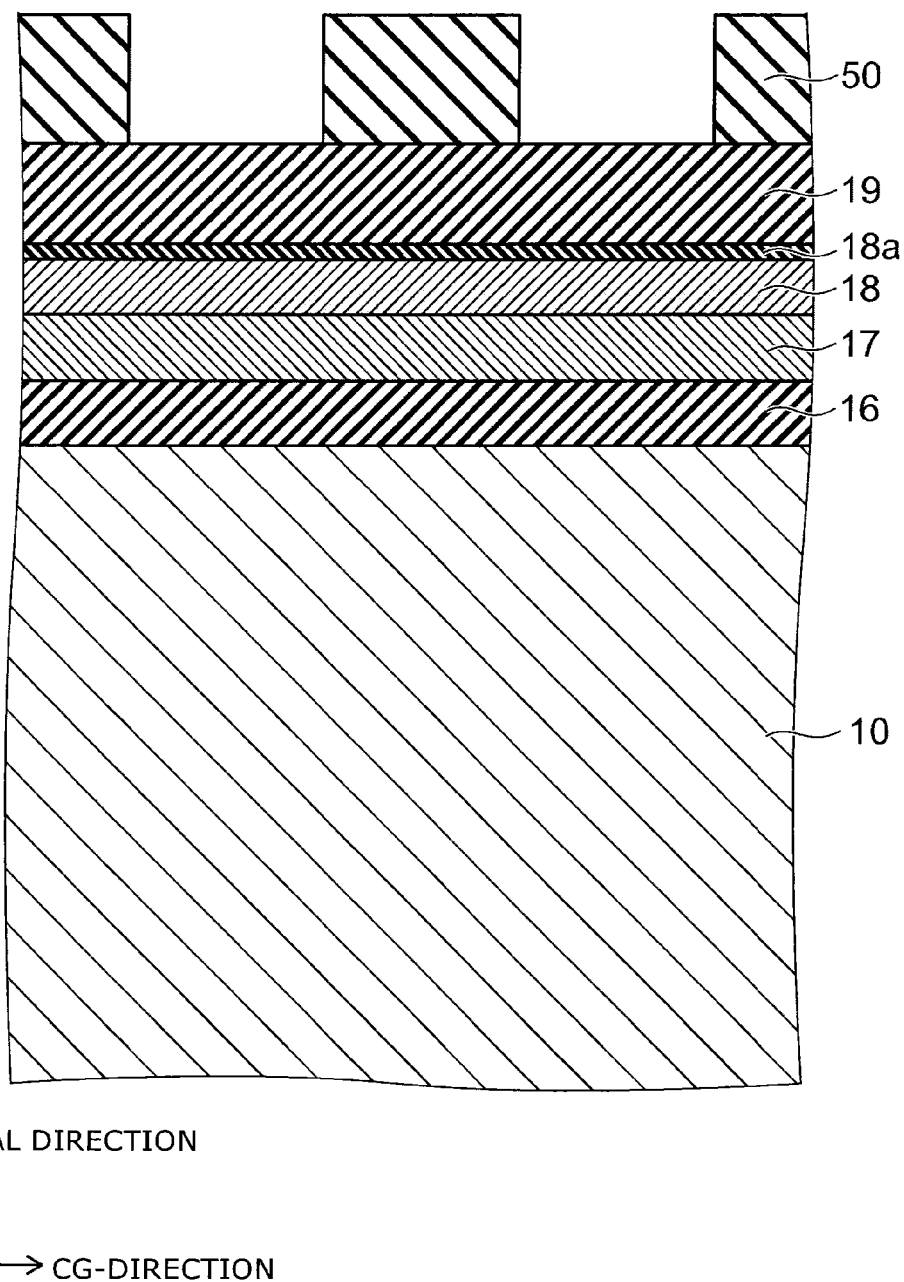
FIGS. 4 and 5 are process sectional views illustrating a method for manufacturing the semiconductor memory device according to the first embodiment.
Figure 5:
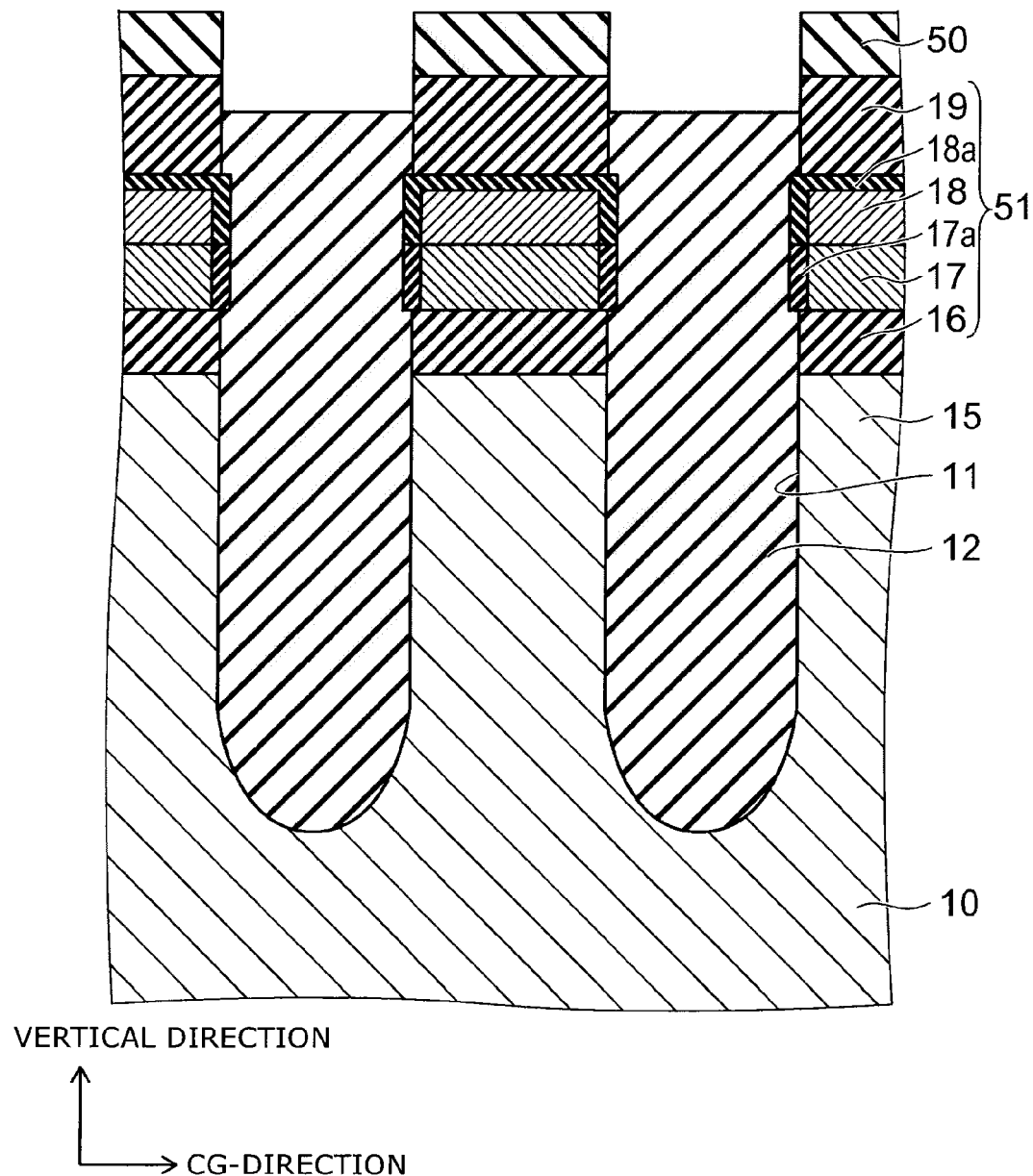

FIGS. 4 and 5 are process sectional views illustrating the method for manufacturing a semiconductor memory device according to the embodiment.

First, as shown in FIG. 4, a silicon substrate 10 is prepared. Then, on the entire surface of the silicon substrate 10, a tunnel insulating film 16, a silicon film 17, and a metal silicide film 18 are formed in this order. Next, on the metal silicide film 18, a hafnium oxide film 19 is formed. At this time, with the deposition of hafnium oxide, the upper part of the metal silicide film 18 is oxidized into an oxidized portion 18a. Then, on the hafnium oxide film 19, a hard mask 50 made of e.g. silicon nitride is formed. The hard mask 50 is formed in a line-and-space shape extending in the AA-direction.

Next, as shown in FIG. 5, the hard mask 50 is used as a mask to perform anisotropic etching such as RIE (reactive ion etching). Thus, the hafnium oxide film 19, the metal silicide film 18, the silicon film 17, and the tunnel insulating film 16 are selectively removed to form a plurality of intermediate stacked bodies 51 shaped like lines extending in the AA-direction. Simultaneously, the upper part of the silicon substrate 10 is selectively removed to form a trench 11 directly below the region between the intermediate stacked bodies 51.

Next, an oxygen-containing insulating material is deposited on the entire surface. For instance, silicon oxide is deposited by CVD (chemical vapor deposition) technique with TEOS (tetraethoxysilane, $Si(OC_2H_5)_4$) and ozone ($O_3$) used as a raw material. At this time, the side surface of the silicon film 17 and the metal silicide film 18 exposed at the side surface of the intermediate stacked body 51 is oxidized. Thus, an oxidized portion 17a is formed in the side part of the silicon film 17 facing in the CG-direction. Simultaneously, an oxidized portion 18a is formed in the side part of the metal silicide film 18 facing in the CG-direction. Here, when the side part of the silicon film 17 and the side part of the metal silicide film 18 are oxidized, the volume is increased. Thus, the oxidized portion 17a and 18a protrude outside from the side surface of the intermediate stacked body 51.

Then, etch-back is performed to remove the upper part of silicon oxide. Thus, a device isolation insulator 12 is formed in the trench 11 and between the intermediate stacked bodies 51. At this time, the portion of the silicon substrate 10 partitioned by the device isolation insulator 12 constitutes an active area 15. Then, the hard mask 50 is removed.

Next, as shown in FIG. 1, on the entire surface, a silicon oxide film 21, a hafnium oxide film 22, and a control gate electrode 23 are formed in this order. The control gate electrode 23 is formed from e.g. tungsten.

Next, as shown in FIG. 2, a hard mask (not shown) is formed in a line-and-space shape extending in the CG-direction. Next, this hard mask is used as a mask to perform anisotropic etching such as RIE. Thus, the intermediate stacked body 51 and the upper part of the device isolation insulator 12 are selectively removed to form a plurality of gate stacked bodies 20 shaped like lines extending in the CG-direction.

Next, an oxygen-containing insulating material is deposited on the entire surface. For instance, silicon oxide is deposited by coating technique with polysilazane used as a raw material. Thus, an interlayer insulating film 30 is formed between and above the gate stacked bodies 20. At this time, the side surface of the silicon film 17 and the metal silicide film 18 exposed at the side surface of the gate stacked body 20 is oxidized. Thus, an oxidized portion 17a is formed in the side part of the silicon film 17 facing in the AA-direction. Simultaneously, an oxidized portion 18a is formed in the side part of the metal silicide film 18 facing in the AA-direction. Due to volume expansion associated with oxidation, the oxidized portions 17a and 18a protrude outside from the side surface of the gate stacked body 20.

Next, heat treatment is performed in an oxidizing atmosphere to modify silicon oxide forming the device isolation insulator 12 and the interlayer insulating film 30. At this time, the side part of the metal silicide film 18 is covered with the oxidized portion 18a. This suppresses oxidation of the metal silicide film 18.

Next, the upper surface of the interlayer insulating film 30 is planarized by e.g. CMP (chemical mechanical polishing). Then, an upper wiring and the like (not shown) are formed. Thus, the semiconductor memory device 1 is manufactured.

Next, the effect of the embodiment is described.

FIGS. 6A to 6D are band gap diagrams illustrating the effect of the embodiment. FIGS. 6A and 6B show a semiconductor memory device according to a comparative example not provided with the metal silicide film 18. FIGS. 6C and 6D show the semiconductor memory device according to the embodiment provided with the metal silicide film 18.

In the semiconductor memory device 1 according to the embodiment, a write voltage is applied between the control gate electrode 23 as a positive electrode and the active area 15 as a negative electrode. Thus, electrons are injected from the active area 15 through the tunnel insulating film 16 into the silicon film 17 and the metal silicide film 18. Accordingly, charge is accumulated in the floating gate electrode made of the silicon film 17 and the metal silicide film 18. This changes the threshold of the memory transistor formed for each nearest portion between the active area 15 and the control gate electrode 23. Thus, this memory transistor can be written with a value.

Here, as shown in FIGS. 6A and 6B, in the device according to the comparative example lacking the metal silicide film 18, when the write voltage is applied, a depletion layer 55 is formed in the portion on the hafnium oxide film 19 side of the floating gate electrode, i.e., the silicon film 17. This decreases coupling to the control gate electrode 23. Furthermore, when the write voltage is not applied, the energy difference between the silicon film 17 and the IPD film is small. This results in poor charge retention characteristics.

In contrast, as shown in FIGS. 6C and 6D, in the device according to the embodiment having the metal silicide film 18, the metal silicide film 18 functions as a metal gate. Thus, the application of write voltage produces no depletion layer. This improves writing characteristics. Furthermore, when the write voltage is not applied, the energy difference between the metal silicide film 18 and the IPD film is large. This results in good charge retention characteristics.

Furthermore, in the embodiment, the metal silicide film 18 is formed from metal silicide. Thus, in the process of manufacturing the device 1, in the step in which the metal silicide film 18 is exposed to an oxidizing atmosphere such as the step of forming the device isolation insulator 12 and the step of forming the interlayer insulating film 30, the oxidized portion 18a made of silicon oxide is formed as a robust coating. This can suppress further oxidation of the metal silicide film 18 in e.g. these formation steps and the subsequent heat treatment step for modifying silicon oxide. Thus, the metal silicide portion 18b can be left stably.

In contrast, if, for instance, a metal film made of a metal such as tungsten is provided instead of the metal silicide film 18, then the metal film is oxidized into insulator in the aforementioned oxidizing atmosphere step.

Here, after forming the interlayer insulating film 30, in the heat treatment in the oxidizing atmosphere performed for film modification, both an oxidizing gas and a reducing gas may be contained in the atmosphere. This can selectively oxidize silicon contained in the silicon film 17 and the metal silicide film 18 while suppressing oxidation of the metal, such as tungsten, contained in the metal silicide film 18 and the control gate electrode 23. As a result, while suppressing oxidation of the control gate electrode 23, the oxidized portion 18a of the metal silicide film 18 can be formed more robustly. Thus, the metal silicide portion 18b therein can be protected more reliably. As the oxidizing gas, for instance, water vapor ($H_2O$) can be used. As the reducing gas, for instance, hydrogen ($H_2$) can be used.

Furthermore, nitrogen may be contained in the metal silicide film 18. In this case, the metal silicide film 18 is formed from metal silicide nitride such as WSiN and TaSiN. By containing nitrogen in the metal silicide film 18, the oxidation reaction can be further suppressed.

Second Embodiment

Next, a second embodiment is described.

Figure 7:
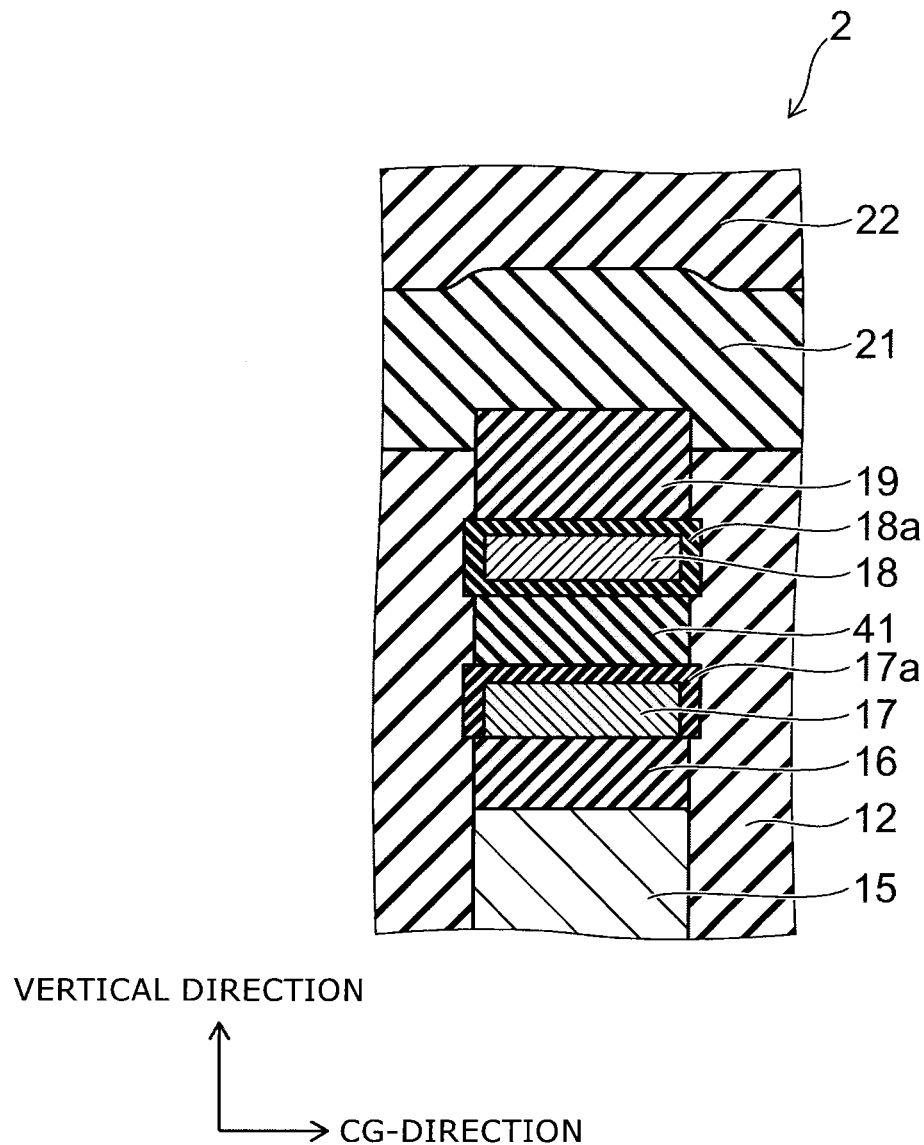
FIG. 7 is a sectional view illustrating a semiconductor memory device according to a second embodiment.

FIG. 7 is a sectional view illustrating a semiconductor memory device according to the embodiment.

As shown in FIG. 7, the semiconductor memory device 2 according to the embodiment is different from the semiconductor memory device 1 (see FIG. 1) according to the above first embodiment in that a silicon oxide film 41 made of silicon oxide is provided between the silicon film 17 and the metal silicide film 18. In this case, an oxidized portion 17a is formed also in the upper part of the silicon film 17, and an oxidized portion 18a is formed also in the lower part of the metal silicide film 18.

The configuration, manufacturing method, and effect of the embodiment other than the foregoing are similar to those of the above first embodiment.

Third Embodiment

Next, a third embodiment is described.

Figure 8:
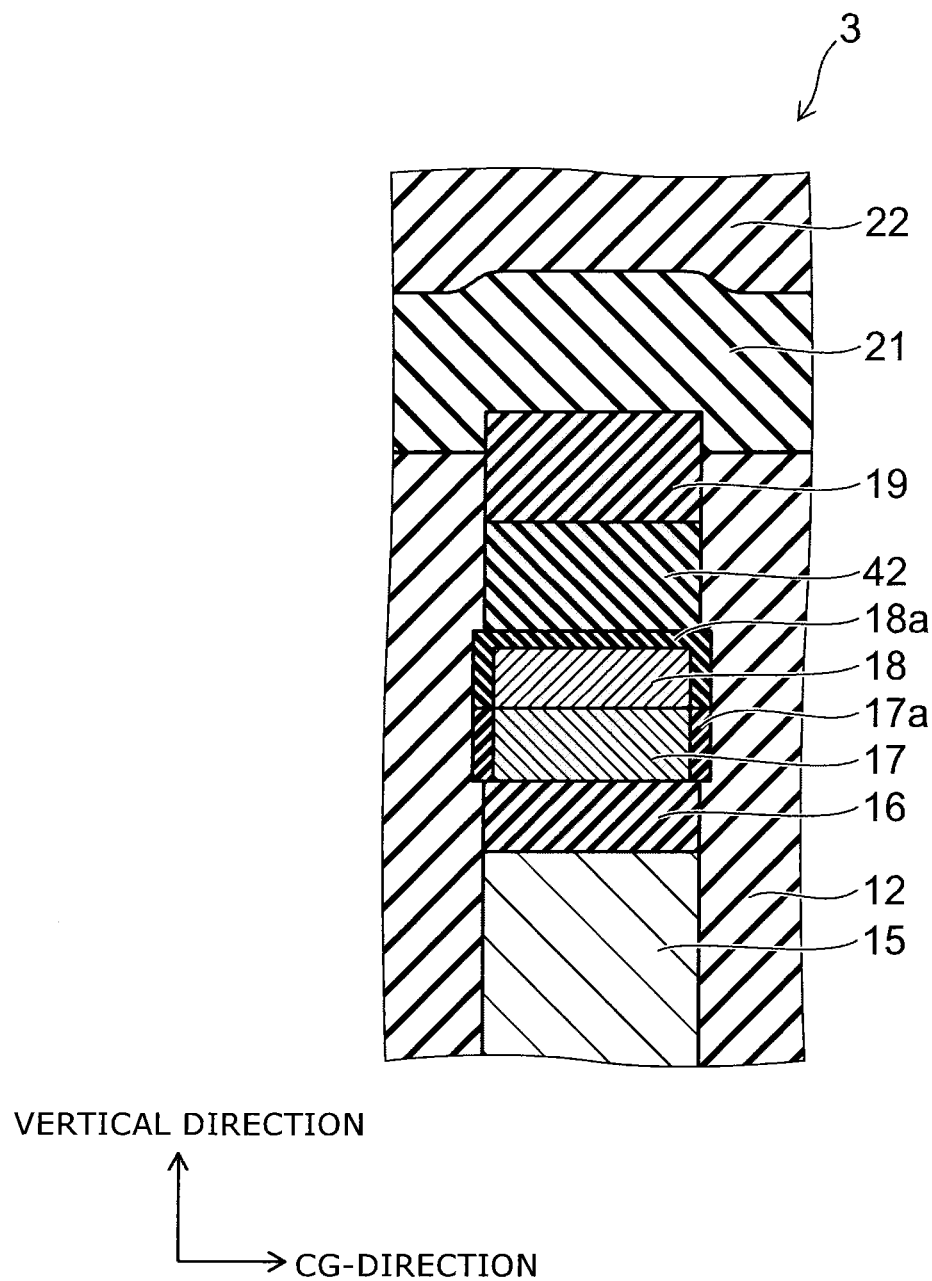
FIG. 8 is a sectional view illustrating a semiconductor memory device according to a third embodiment.

FIG. 8 is a sectional view illustrating a semiconductor memory device according to the embodiment.

As shown in FIG. 8, the semiconductor memory device 3 according to the embodiment is different from the semiconductor memory device 1 (see FIG. 1) according to the above first embodiment in that a charge trap film 42 is provided between the metal silicide film 18 and the hafnium oxide film 19. The charge trap film 42 is formed from a material capable of accumulating charge. For instance, the charge trap film 42 is formed from silicon nitride (SiN). This can improve the charge retention characteristics of the floating gate electrode, and further enhance the data retention characteristics of the memory transistor.

The configuration, manufacturing method, and effect of the embodiment other than the foregoing are similar to those of the above first embodiment.

Fourth Embodiment

Next, a fourth embodiment is described.

Figure 9:
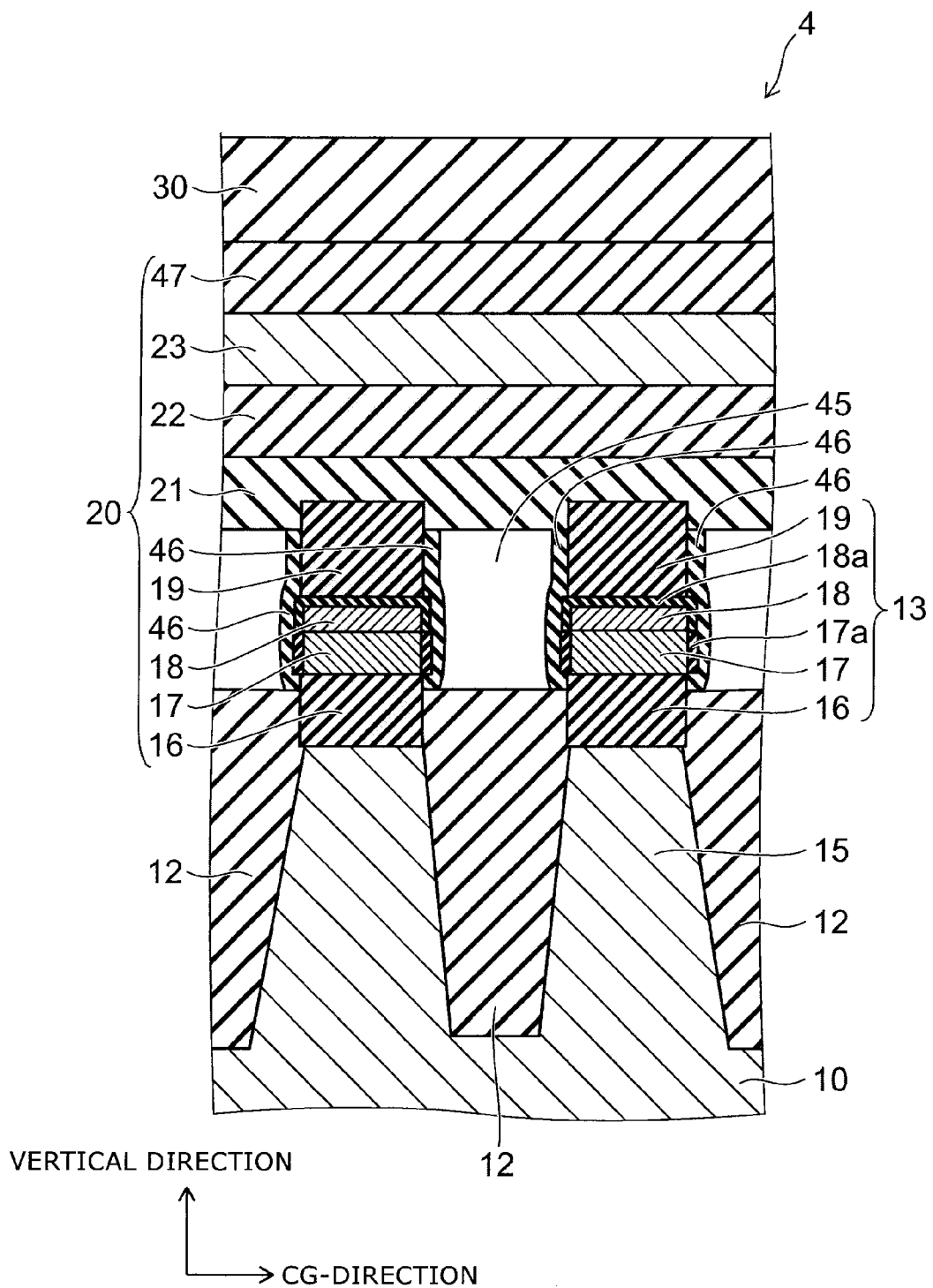
FIG. 9 is a sectional view parallel to the CG-direction illustrating a semiconductor memory device according to a forth embodiment.

FIG. 9 is a sectional view parallel to the CG-direction illustrating a semiconductor memory device according to the embodiment.

Figure 10:
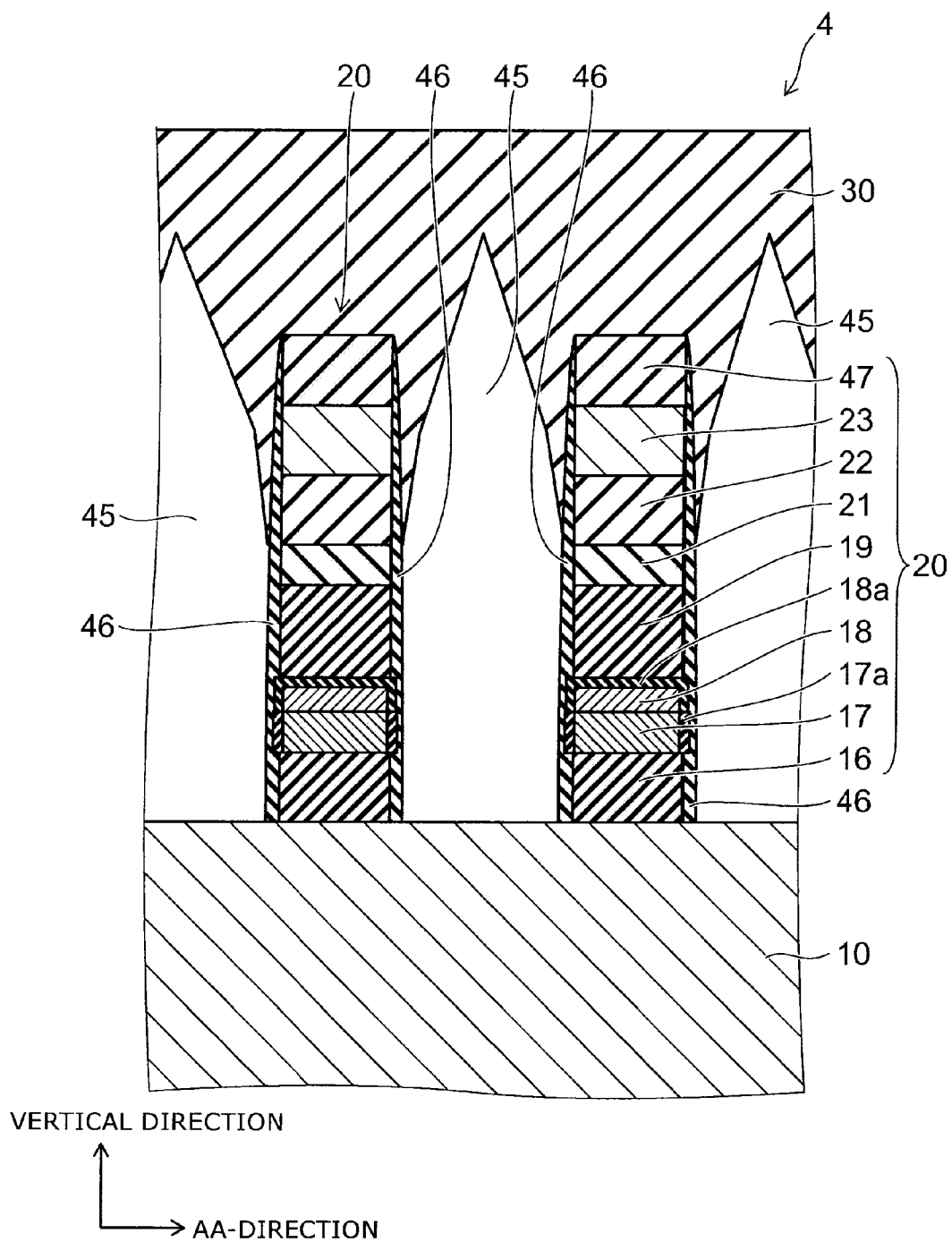
FIG. 10 is a sectional view parallel to the AA-direction illustrating the semiconductor memory device according to the forth embodiment.

FIG. 10 is a sectional view parallel to the AA-direction illustrating the semiconductor memory device according to the embodiment.

As shown in FIGS. 9 and 10, the semiconductor memory device 4 according to the embodiment is different from the semiconductor memory device 1 (see FIGS. 1 and 2) according to the above first embodiment in that an air gap 45 is formed between the memory cells, that a sidewall 46 is provided on the side surface of the gate stacked body 20, and that a hard mask 47 is left on the gate stacked body 20.

More specifically, in the gate stacked body 20, a hard mask 47 made of e.g. silicon nitride (SiN) is provided on the control gate electrode 23. A sidewall 46 is provided on the side surface facing in the AA-direction of the gate stacked body 20 including the hard mask 47. Furthermore, a sidewall 46 is provided also on the side surface facing in the CG-direction of the lower stacked body 13. The sidewall 46 is made of e.g. silicon oxide and has a thickness of e.g. 2 nm.

Furthermore, in the AA-direction, the interlayer insulating film 30 is not substantially inserted between the gate stacked bodies 20, but an air gap 45 is formed therebetween. Furthermore, in the CG-direction, the device isolation insulator 12 is not substantially provided between the lower stacked bodies 13, but an air gap 45 is formed therebetween.

Next, a method for manufacturing the semiconductor memory device 4 according to the embodiment is described.

First, as in the above first embodiment, the steps shown in FIGS. 4 and 5 are performed. However, the upper surface of the device isolation insulator 12 is set back to a position comparable to the tunnel insulating film 16.

Next, as shown in FIGS. 9 and 10, on the entire surface, a silicon oxide film 21, a hafnium oxide film 22, and a control gate electrode 23 are formed in this order. Next, on the control gate electrode 23, a hard mask 47 is formed in a line-and-space shape extending in the CG-direction. Next, the hard mask 47 is used as a mask to perform anisotropic etching. Thus, a plurality of gate stacked bodies 20 shaped like lines extending in the CG-direction are formed. At this time, the hard mask 47 is left.

Next, on the side surface of the gate stacked body 20, a sidewall 46 made of e.g. silicon oxide and having a thickness of approximately 2 nm is formed. The sidewall 46 is formed also on the side surface of the lower stacked body 13 facing in the CG-direction. Next, heat treatment is performed in a mixed atmosphere containing hydrogen and water vapor. Thus, silicon contained in the silicon film 17 and the metal silicide film 18 is oxidized through the sidewall 46. At this time, hydrogen as a reducing gas and water vapor as an oxidizing gas are used in mixture. Accordingly, compared with the metal contained in the metal silicide film 18, silicon is preferentially oxidized. Thus, an oxidized portion 17a is formed in the side part of the silicon film 17, and an oxidized portion 18a is formed in the side part of the metal silicide film 18.

Next, for instance, by depositing silicon oxide under a condition with poor coverage, an interlayer insulating film 30 is formed above the gate stacked bodies 20. At this time, before the interlayer insulating film 30 is substantially inserted into the interstice between the gate stacked bodies 20 and between the lower stacked bodies 13, the interlayer insulating film 30 seals the upper part of this interstice. Thus, an air gap 45 is formed in this interstice. Next, the upper surface of the interlayer insulating film 30 is planarized. Then, an upper wiring and the like (not shown) are formed. Thus, the semiconductor memory device 4 is manufactured.

According to the embodiment, an air gap 45 is formed between the gate stacked bodies 20. Thus, the interwiring capacitance between the gate stacked bodies 20 can be reduced.

The configuration, manufacturing method, and effect of the embodiment other than the foregoing are similar to those of the above first embodiment.

The embodiments described above can realize a semiconductor memory device with good data retention characteristics and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
a semiconductor substrate;
a first insulating film provided on the semiconductor substrate;
a floating gate comprising,
a silicon film provided on the first insulating film, and
a metal silicide film provided on the silicon film, the metal silicide film including,
an oxidized portion made of silicon oxide and having an inverted cup shape, and
a metal silicide portion made of metal silicide being located inside the oxidized portion, said metal silicide portion having side surfaces circumferentially surrounded by the oxidized portion and a top surface covered by the oxidized portion;
a second insulating film provided on the metal silicide film; and
a control gate electrode provided on the second insulating film.

2. The device according to claim 1, further comprising:
a silicon oxide film located between the silicon film and the metal silicide film.

3. The device according to claim 1, wherein the metal silicide film contains nitrogen.

4. The device according to claim 1, further comprising:
a third insulating film provided on the second insulating film.

5. The device according to claim 1, wherein the metal silicide film contains tungsten or tantalum.

6. A semiconductor memory device comprising:
a semiconductor substrate;
a device isolation insulator extending in a first direction and partitioning an upper part of the semiconductor substrate into a plurality of portions;
a first insulating film provided on the semiconductor substrate;
plural floating gates comprising,
a silicon film provided on the first insulating film and divided along the first direction, and
a metal silicide film provided on the silicon film, the metal silicide film including,
an oxidized portion made of silicon oxide and having an inverted cup shape, and
a metal silicide portion made of metal silicide being located inside the oxidized portion, said metal silicide portion having side surfaces circumferentially surrounded by the oxidized portion and a top surface covered by the oxidized portion;
a second insulating film provided on the metal silicide film; and
a control gate electrode provided on the second insulating film and the device isolation insulator and extending in a second direction crossing the first direction.

7. The device according to claim 6, further comprising:
a sidewall provided on a side surface of a stacked body including the first insulating film, the silicon film, the metal silicide film, the second insulating film, and the electrode; and
an interlayer insulating film provided above the stacked body,
wherein the stacked body is provided in a plurality, and an air gap is formed between the sidewalls.

* * * * *